United States Patent
Xia et al.

[11] Patent Number: 5,940,052
[45] Date of Patent: Aug. 17, 1999

[54] CURRENT MONITOR FOR FIELD EMISSION DISPLAYS

[75] Inventors: Zhong-Yi Xia; Dwayne Kreipl; Glenn Piper, all of Boise, Id.

[73] Assignee: Micron Technology, Inc., Boise, Id.

[21] Appl. No.: 08/783,044

[22] Filed: Jan. 15, 1997

[51] Int. Cl.[6] .................................................. G09G 3/22
[52] U.S. Cl. ............................................. 345/74; 345/904
[58] Field of Search .............................. 345/204, 74, 75, 345/904; 324/707, 403

[56] References Cited

U.S. PATENT DOCUMENTS

| | | | |
|---|---|---|---|
| 4,514,727 | 4/1985 | Van Antwerp | 340/793 |
| 4,810,934 | 3/1989 | Shimoda et al. | 315/107 |
| 5,262,698 | 11/1993 | Dunham | 315/169.1 |
| 5,404,081 | 4/1995 | Kane et al. | 315/169.1 |
| 5,410,218 | 4/1995 | Hush | 315/169.1 |
| 5,654,729 | 8/1997 | Garcia | 345/74 |
| 5,656,892 | 8/1997 | Zimlich et al. | 345/212 |
| 5,721,472 | 2/1998 | Browning et al. | 345/74 |
| 5,721,560 | 2/1998 | Cathey, Jr. et al. | 345/74 |

FOREIGN PATENT DOCUMENTS

WO 92/05571  4/1992  WIPO ............................ H01J 1/02

Primary Examiner—Richard A. Hjerpe
Assistant Examiner—Ronald Laneau
Attorney, Agent, or Firm—Seed and Berry LLP

[57] ABSTRACT

A current measuring circuit for a field emission display includes a testing circuit coupled between a high voltage testing source and the display. The testing circuit includes a sampling circuit formed from a sampling impedance coupled in parallel with a high isolation switch. In one embodiment, the sample circuit is on the high voltage side of the testing source. In another embodiment, the sampling circuit is on the return (low voltage) side of the testing source. In normal operation, the switch is closed to provide the testing voltage directly to the display. During testing, the switch is open so that current flows through the sampling impedance. A sensing circuit coupled to the output of the sampling impedance determines a voltage change in response to opening of the switch. In response to a sensed voltage change, a microprocessor-based controller computes the current drawn by the display. A burn-in system includes a bank of displays within a burn-in oven each selectively coupleable to the testing circuit by respective switches. Another testing system includes separate supply and testing sources each coupled to displays by respective switches. The switches are opened and closed such that the displays are always coupled to one or both of the voltage sources to prevent the switches from being exposed to high voltage swings.

45 Claims, 4 Drawing Sheets

CURRENT MONITOR FOR FIELD EMISSION DISPLAYS

STATEMENT AS TO GOVERNMENT RIGHTS

This invention was made with government support under Contract No. DABT-63-93-C-0025 by Advanced Research Projects Agency ("ARPA"). The government has certain rights to this invention.

TECHNICAL FIELD

The present invention relates to field emission displays and more particularly to current monitoring in field emission displays.

BACKGROUND OF THE INVENTION

Flat panel displays are widely used in a variety of applications, including computer displays. One type of device well-suited for such applications is the field emission display. Field emission displays typically include a generally planar substrate having an array of projecting emitters. In many cases, the emitters are conical projections integral to the substrate. Typically, the emitters are grouped into emitter sets where the bases of the emitters are commonly connected. The term emitters will be used herein to refer to single emitters or emitters grouped into sets.

A conductive extraction grid is positioned above the emitters and driven with a voltage of about 30–120 V. The emitters are then selectively activated by providing a current path from the bases to the ground. Providing a current path to ground allows electrons to flow to the emitters by the extraction grid voltage. If the voltage differential between the emitters and extraction grid is sufficiently high, the resulting electric field extracts electrons from the emitters.

The field emission display also includes a display screen mounted adjacent the substrate. The display screen is formed from a glass plate coated with a transparent conductive material to form an anode biased to about 1–2 kV. A cathodoluminescent layer covers the exposed surface of the anode. The emitted electrons are attracted by the anode and strike the cathodoluminescent layer, causing the cathodoluminescent layer to emit light at the impact site. The emitted light then passes through the anode and the glass plate where it is visible to a viewer.

The brightness of the light produced in response to the emitted electrons depends, in part, upon the rate at which electrons strike the cathodoluminescent layer, which in turn depends upon the magnitude of current flow to the emitters. The brightness of each area can thus be controlled by controlling the current flow to the respective emitter. By selectively controlling the current flow to the emitters, the light from each area of the display can be controlled and an image can be produced. The light emitted from each of the areas thus becomes all or part of a picture element or "pixel."

Anodes of such displays typically draw low currents on the order of just a few microamperes while operating at anode voltages of 1–2 kV. Measuring such low currents at such high voltages can require very expensive equipment. It can therefore be impractical to use available equipment to measure the anode current of field emission displays in a production environment where large numbers of field emission displays are tested repeatedly at reasonable speed and affordable cost.

The current to a single anode can be determined by monitoring current flow through the low voltage side of the voltage supply providing the anode voltage. However, such an approach becomes undesirable where a single high voltage supply is used to test several displays, because it can be difficult to determine the portion of the current attributable to each individual display.

SUMMARY OF THE INVENTION

A current measuring circuit for measuring anode current in a field emission display includes a sampling impedance serially coupled to a supply voltage that provides anode current to the display. In one embodiment of the invention, the current measuring circuit includes a sampling circuit that contains the sampling impedance. The sampling circuit is serially coupled between the supply voltage and the display. The sampling circuit also includes a switch coupled in parallel with the sampling impedance and controlled by a control signal $V_{CON}$. The switch is an electrically controlled switch having a high isolation, such as an optoisolator.

During normal (non-testing) operation, the switch is closed to bypass the sampling impedance. The switch therefore transfers the supply voltage directly to the display. During testing, the switch is opened so that current flows through the sampling impedance. The current flowing through the sampling impedance causes a slight drop in voltage supply to the display; however, the slight voltage drop does not significantly affect the operation of the display.

A sensing circuit is coupled to monitor the output voltage of the sampling impedance. The sensing circuit includes a capacitor and a test resistor serially coupled between the sampling impedance output and the reference potential. A voltage monitor is coupled to a node joining the capacitor and the test resistor.

When the switch is opened, the capacitor couples the change in output voltage from the sampling impedance to the node. There, the voltage monitor detects the change in node voltage and provides an output signal to a microprocessor-based controller in response. The controller then calculates the current flowing to the display from the monitored node voltage.

A burn-in system according to the invention includes a plurality of displays within a burn-in oven. Each of the displays is driven by a single supply line that is selectively coupleable to a supply voltage through a respective switch. A testing circuit is serially coupled to the voltage source to monitor current drawn by each of the respective displays that is coupled to the voltage source. Because the testing circuit uses only a single conductor for each of the displays, conductors occupy less space within the burn-in oven as compared to two-conductor systems. Consequently, additional space is freed so that the number of displays within the burn-in oven can be increased.

One embodiment of a testing system according to the invention includes a testing voltage source and a supply voltage source that are selectively coupled through switches to the displays being tested. At first, the displays are all coupled to the supply voltage source. Then, one of the displays is coupled to the testing voltage source without removing the supply voltage source. Little or no current flows between the testing voltage source and supply voltage source, because the two voltage sources are maintained at substantially equal voltages.

Next, one of the switches is opened such that the display being tested is isolated from the supply voltage source and receives current only from the testing voltage source. A testing circuit according to the invention determines the current drawn by the display. Then, the switch is closed so that the display is coupled to both the testing voltage source and the supply voltage source. Then the display is isolated from the testing voltage source. Because the display is continuously coupled to one or both of the testing voltage source and supply voltage source, the display and switches are not subjected to a large change in voltage. Consequently, the display and switches are less likely to be damaged by switching of high voltages.

DETAILED DESCRIPTION OF THE INVENTION

Figure 1A:
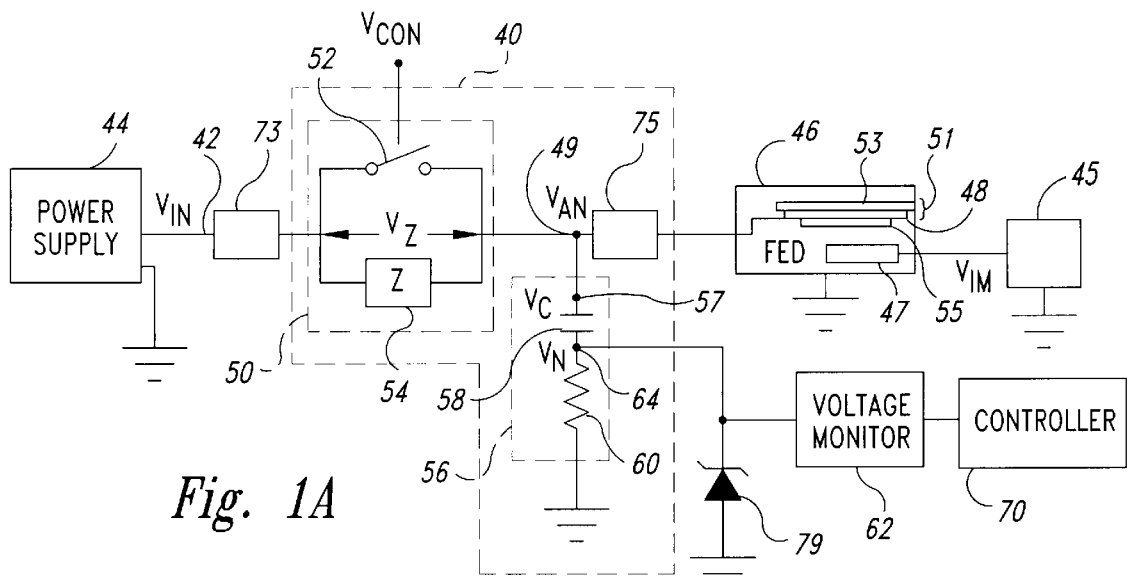
FIG. 1A is a schematic of a testing system including a testing circuit coupled to a field emission display where the testing circuit includes an open sampling switch.

As shown in FIG. 1A, a testing circuit 40 is serially coupled on a high voltage line 42 between a measuring power supply 44 and a field emission display 46. The power supply 44 is a high voltage supply that provides an input voltage $V_{IN}$ of about 1–2 kV to an anode 48 of the field emission display 46. The power supply 44 can be any suitable power supply having adequate voltage levels and stability. The field emission display 46 is a known structure having an emitter substrate 47 positioned opposite a display screen 51 that includes the anode 48. A glass plate 53 carries the anode 48 and a cathodoluminescent layer 55. A video signal generator 45, such as a television receiver, VCR, camcorder or computer, controls operation of the display 46 by providing a video image signal $V_{IM}$ to the emitter substrate 47. For testing, the video signal generator 43 sets the image signal $V_{IM}$ to a level corresponding to maximum illumination so that the current draw of the anode will be maximized. For color displays, this means that the red, green and blue components of the image signal will all be at their maximum levels to produce a "white" image.

The testing circuit 40 includes a sampling circuit 50 that couples power from the power supply 44 to the field emission display 46. The sampling circuit 50 is formed from a sampling switch 52 and a sampling impedance 54 that are coupled in parallel. The sampling switch 52 is preferably an optoisolator driven by a control signal $V_{CON}$, although any selectively actuatable switching device having a sufficiently high isolation may be used. The sampling impedance 54 is preferably a resistor having an impedance of about 50 KΩ-1 MΩ.

The testing circuit 40 also includes a sensing circuit 56 coupled between an output node 49 and a reference potential. The sensing circuit 56 is preferably formed from a high voltage capacitor 58 serially coupled at a test node 64 to a high impedance test resistor 60 having a resistance of approximately 10–20 MΩ. One terminal 57 of the capacitor 58 couples directly to the output node 49 of the testing circuit 40 and the other terminal couples to the test node 64. A voltage monitor 62 is coupled to the test node 64 between the capacitor 58 and test resistor 60 to monitor the voltage of the test node 64 relative to the reference potential.

During normal operation, sampling switch 52 is closed and bypasses the sampling impedance 54 such that the voltage on the high voltage line 42 is connected directly to the anode 48. Consequently, the anode voltage $V_{AN}$ equals the entire input voltage $V_{IN}$. The terminal 57 of the capacitor 58 also receives the entire input voltage $V_{IN}$. The test resistor 60 references the remaining terminal of the capacitor 58 to ground. The capacitor voltage $V_C$ is thus equal to the input voltage $V_{IN}$.

For testing, control signal $V_{CON}$ (FIG. 2A) goes from low to high at times $t_1$, to switch the state of the sampling switch 52 and initiate testing. Current from the power supply 44 flows through the sampling impedance 54 to reach the anode 48. The resulting voltage drop $V_Z$ across the sampling impedance 54 slightly lowers the anode voltage $V_{AN}$ from the input voltage $V_{IN}$, as shown to exaggerated scale FIG. 2B. Consequently, the voltage at the test node $V_N$ is reduced by the voltage $V_Z$ compared to the normal operation of FIG. 1B, as the voltage across the capacitor $V_C$ cannot change instantaneously.

Figure 2A:
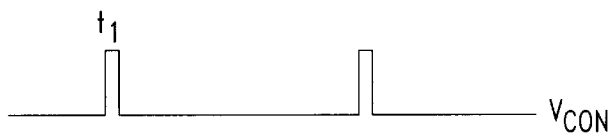
FIG. 2A is a signal timing diagram showing a switch control signal provided to the circuit of FIG. 1A.
Figure 2B:
FIG. 2B is a signal timing diagram showing anode voltage change in response to the control signal of FIG. 2A.

The sampling impedance 54 is selected such that the voltage drop across the sampling impedance 54 is on the order of 1–20 V. Consequently, during testing, the anode voltage $V_{AN}$ shifts negligibly from the input voltage $V_{IN}$ of 1–2 kV. For example, for an input voltage of 1,500 V and a voltage drop across the sampling impedance 54 of 4 V, the anode voltage $V_{AN}$ will change from 1,500 V to 1,496 V as shown in FIG. 2B. Such a small variation in the anode voltage $V_{AN}$ does not significantly affect operation of the display 46.

Rather than monitor the anode voltage $V_{AN}$ directly with a high voltage detector, the monitor 62 measures the change in the test node voltage $V_N$ to determine the anode current. The voltage across the sensing circuit 56 equals the anode voltage $V_{AN}$. However, the voltage $V_C$ across the capacitor 58 does not change instantly. Instead, the capacitor voltage $V_C$ decreases very slowly due to the high impedance of the test resistor 60 so that the capacitor voltage $V_C$ remains substantially constant at 1500 V.

Figure 2C:
FIG. 2C is a signal timing diagram showing measured voltage across a test resistor in response to the control signal of FIG. 2A.

The voltage $V_R$ across the test resistor 60 is equal to the anode voltage $V_{AN}$ minus the capacitor voltage $V_C$ and is also equal to the node voltage $V_N$. Therefore, the voltage $V_R$ across the test resistor 60 jumps from 0 V to −4 V and then begins to decay gradually toward 0 V as the capacitor 58 discharges through the test resistor 60, as shown in FIG. 2C. The rate of decay of the resistor voltage $V_R$ will be determined by the RC time constant of the test resistor 60 and capacitor 58. The value of the test resistor 60 is very large, on the order of 10–20 MΩ, so that the capacitor 58 discharges very slowly through the test resistor 60, as compared to the period of the switch control signal $V_{CON}$. Consequently, the resistor voltage $V_R$ falls very slowly from 4 V and thus appears as a substantially constant voltage in FIG. 2C.

The voltage monitor 62 detects the initial rise and gradual fall of the voltage $V_R$ across the test resistor 60 and provides a corresponding digital output to a microprocessor-based controller 70. The controller 70 then calculates the voltage drop across the test resistor 60. The voltage monitor 62 directly indicates the magnitude of current flowing through the sampling impedance 54 according to Ohm's Law, because the peak change in the resistor voltage $V_R$ equals the voltage drop $V_Z$ across the sampling impedance 54. The voltage monitor 62 thus indicates the current draw of the field emission display 46.

To obtain reliable current readings, the sampling switch 56 can be switched periodically. The voltage monitor 62 then synchronously detects the voltage $V_N$ at the test node 64. The duty-cycle of the control signal is preferably less than 5% to avoid a change in the equilibrium voltage of the test node 64.

When the sampling switch 52 is closed or when the display 46 draws an undesirably high current, the voltage monitor 62 may receive undesirably high voltage spikes. To prevent damage to the voltage monitor 62, a pair of low pass filters 73, 75 are coupled in series with the sampling circuit 50. The first filter 73 is coupled between the sampling circuit 50 and power supply 44 and the second filter 75 is coupled between the sampling circuit 50 and the display 46. The filters 73, 75 reduce unwanted voltage spikes to limit damage to the voltage monitor 48. For further protection, a Zener diode 79 is coupled between the test node 64 and the reference potential. The Zener diode 79 breaks down quickly to provide a current path to ground if a high voltage spike arrives at the test node 64. The Zener diode 79 thus prevents the high voltage spike from damaging the voltage monitor 62.

Figure 1B:
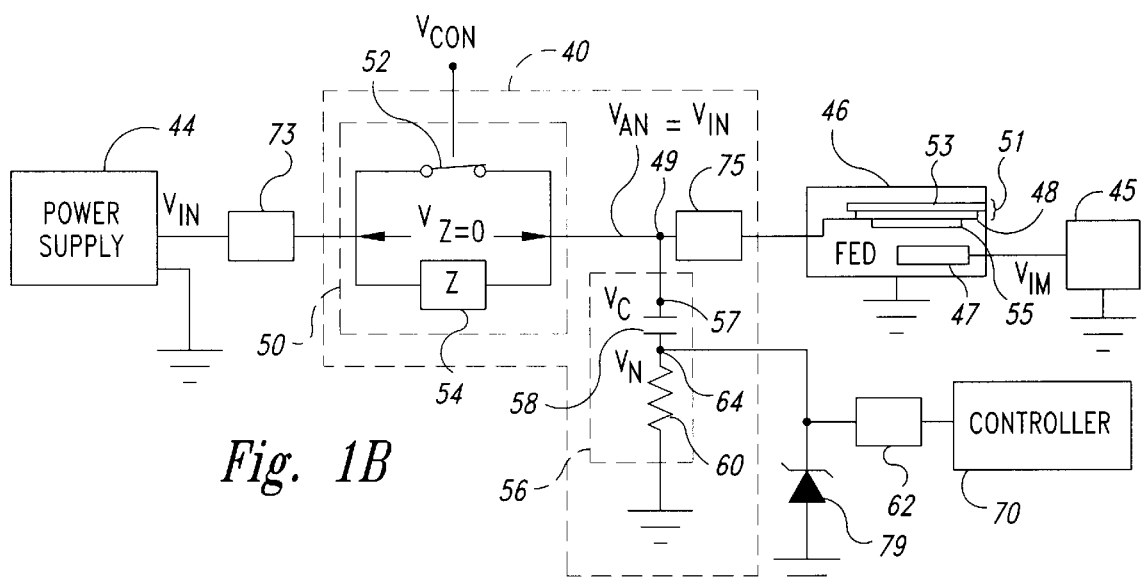
FIG. 1B is a schematic of the testing system of FIG. 1A where the sampling switch is closed.
Figure 3:
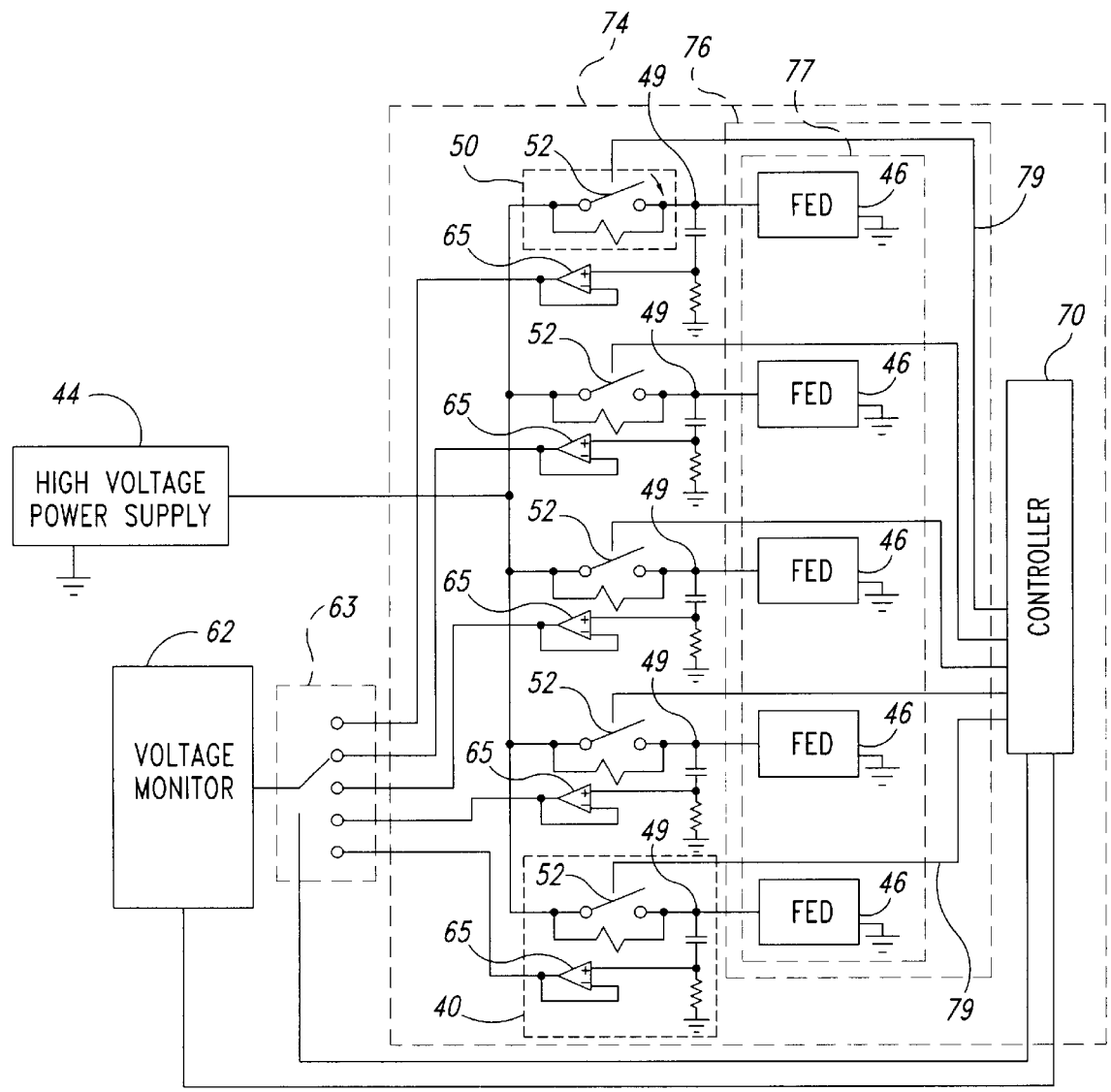
FIG. 3 is a block diagram of a computer-controlled test station for testing more than one display.

FIG. 3 shows the testing circuit 40 of FIGS. 1A, 1B in a computer-controlled multi-display test station 74. The test station 74 includes a bank 76 of field emission displays 46 mounted within a test apparatus 77, such as a burn-in oven or a field emission display lifetime tester. Each of the field emission displays 46 is coupled to the high voltage output of the power supply 44 by a respective sampling circuit 50 that is controlled by the microprocessor-based controller 70. The voltage monitor 62 is selectively coupleable to the sampling circuits 50 through a switch bank 63. The controller 70 selectively actuates the switch bank 63 to couple one of the displays 46 to the voltage monitor 62. Then, the controller 70 activates the corresponding sampling switches 52 to produce a voltage change of the respective output node 49 and receives the measured voltage from the voltage monitor 62 through a unity gain buffer 65. The controller 70 then computes the current flowing into the corresponding field emission display 46 and stores the information. Then, the controller 70 actuates the switch bank 63 to couple the monitor 62 to the next field emission display 46 and switches the corresponding sampling switch 52 to activate the next field emission display 46. The controller 70 then receives the corresponding voltage information through the corresponding buffer 65 and stores the information in its memory. The controller 70 repeats this process for each field emission display in the bank 76 at selected sampling intervals to evaluate the response of the field emission displays 46 over the time that the displays 46 are in the test station 74.

Unlike the embodiment of the test station 78 of FIG. 4, described below, that includes a separate high voltage line for testing in addition to a high voltage line for non-testing operation, the test station 74 of FIG. 3 utilizes only a single high voltage line per field emission display 46 along with respective control lines 79 and a ground reference common to all of the field emission displays 46. The elimination of one high-voltage test line for each display 46 frees additional space within the test station 74 for testing additional displays 46.

Figure 4:
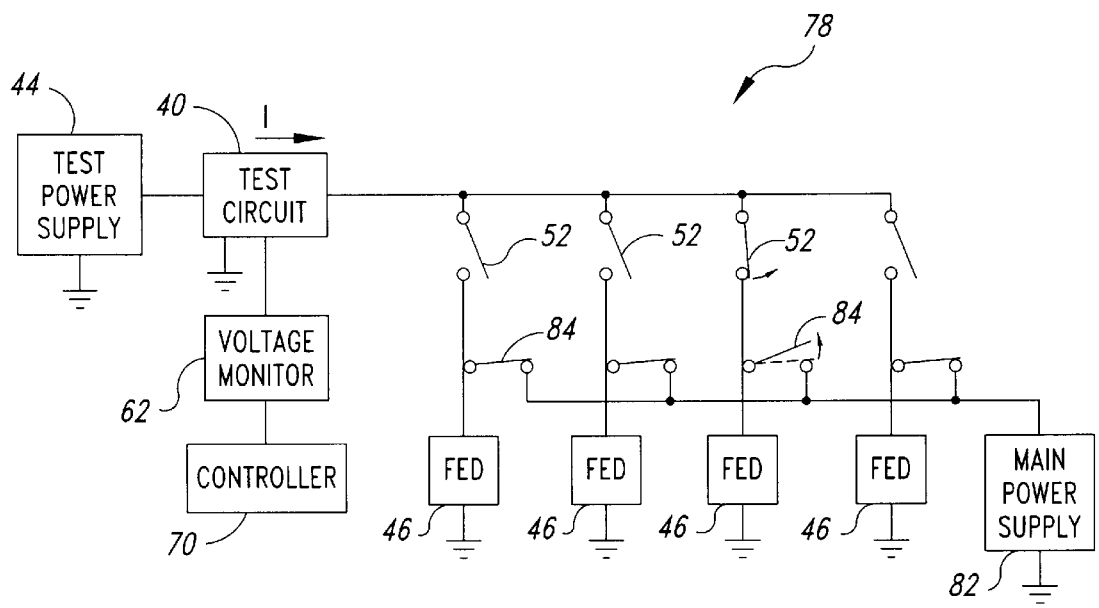
FIG. 4 is a block diagram of a computer-controlled test station for testing more than one display including a main power supply and a testing power supply.

FIG. 4 shows another embodiment of a multi-display test station 78 in which a single monitor 62 monitors a single testing circuit 40 to detect the current through several displays 46, one at a time. In this embodiment, each of the displays 46 is coupleable to a main power supply 82 and a measuring power supply 44. During regular (non-testing) operation, respective isolation switches 84 are closed to couple the displays 46 to the main power supply 82, which is held at a constant voltage. During testing, one of the sampling switches 52 is closed, as shown for the third sampling switch 52 in FIG. 4. The closed sampling switch 52 couples the corresponding display 46 through a single testing circuit 40 to the measuring power supply 44. At this time, the selected display 46 is connected to both the measuring power supply 44 and the main power supply 82. However, no current flows between the measuring power supply 44 and the main power supply 82, because the measuring power supply 44 and main power supply 82 are held at substantially identical voltages.

Next, the isolation switch 84 corresponding to the selected display 46 is opened to isolate the selected display 46 from the main power supply 82. Then, the controller 70 determines the current draw of the display 46 through voltage monitor 62 and testing circuit 40, as discussed above.

Once the current draw of the selected field emission display 46 is measured, the isolation switch 84 is then closed to connect the display 46 to the main power supply 82 once again. Then, the closed sampling switch 52 is opened to isolate the selected display 46 from the measuring power supply 44. Throughout testing, the selected display 46 receives a continuous high voltage, because of the overlap of time during which the switches 52, 84 are closed. Consequently, the selected display 46 is protected against high voltage spikes which may occur when a high voltage is abruptly applied to the display 46. Contacts on the switches are protected because the voltage across the contacts when switching is very small. Thus, there is no arcing, and a high-voltage switching device need not be used.

Figure 5:
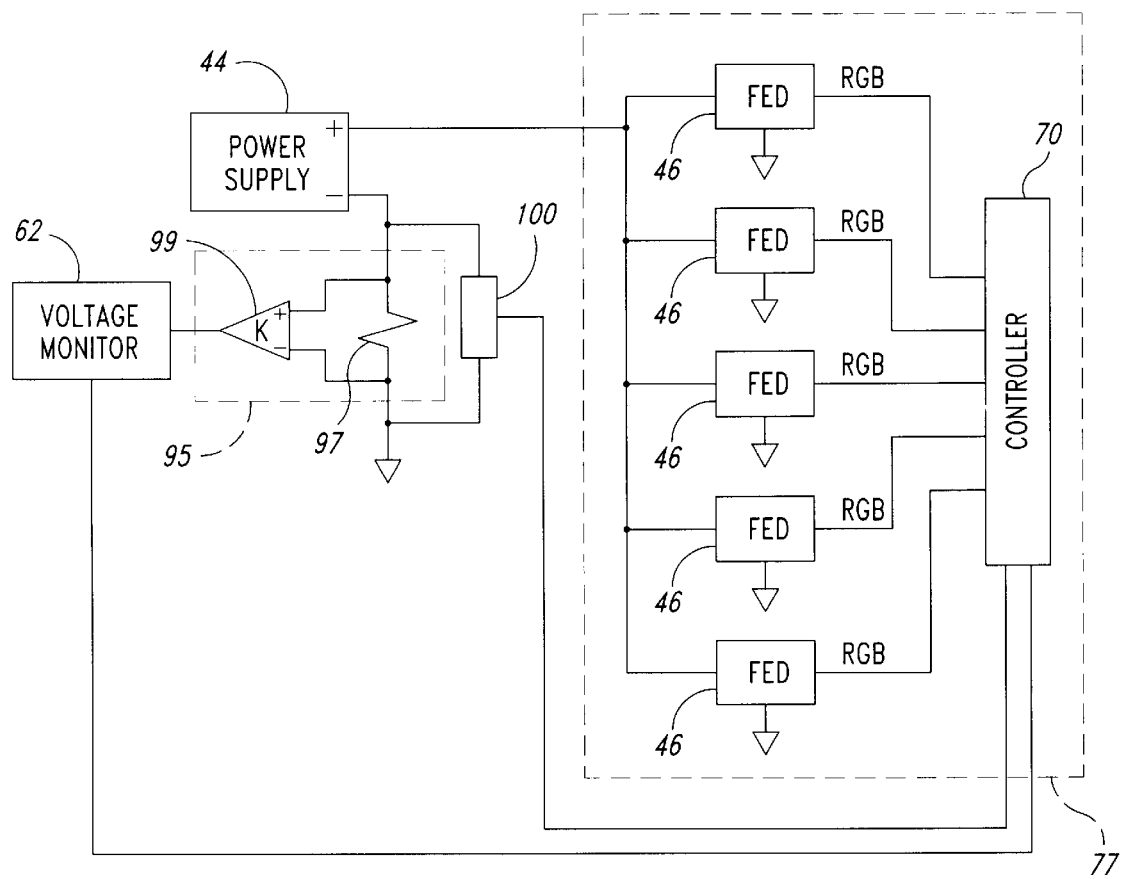
FIG. 5 is a schematic of another embodiment of the invention including a current-to-voltage converter and in which the image signal is selectively activated for a single display.

FIG. 5 shows another embodiment of the invention in which the sampling switch 52 is eliminated. In this embodiment, the high-voltage side of the power supply 44 is coupled directly to the anodes of all of the displays 46 within the test apparatus 77 and each of the displays 46 is coupled to a common ground reference.

Unlike the previously described embodiments, the controller 70 controls the current flow through the displays 46 by controlling the image signal $V_{IM}$ supplied to the respective displays 46. To determine the current draw of selected display 46, the controller sets the red, green, and blue components of the image signal $V_{IM}$ to a "black" level, i.e., no red, green, or blue light is emitted. Then, the controller 70 sets the red, green, and blue components of the selected display 46 to their maximum values so that the selected display 46 will draw the maximum anode current. Because none of the other displays 46 in the test apparatus 77 emits light, the anode currents of the remaining displays 46 will be substantially zero. Consequently, current drawn from the power supply 44 will be attributable only to the anode current of the selected display 46.

The low side of the power supply 44 is coupled to ground through a current-to-voltage converter 95 formed from a test resistor 97 and a buffer amplifier 99. The test resistor 97 provides a current path between the low side of the power supply 44 and ground and the buffer amplifier 99 provides an output voltage to the voltage monitor 62 that corresponds to the current through the test resistor 97, amplified by the amplifier gain K. The output voltage of the current-to-voltage converter 95 indicates the anode current of the selected display 46.

As with the above-described embodiments, the controller selectively activates each of the displays 46 and the voltage monitor 62 provides through the controller 70 an indication of each of the corresponding anode currents.

In addition to the current-to-voltage converter 95, the embodiment of FIG. 5 also includes a bypass switch 100 coupled in parallel with the test resistor 97. Unlike the previously described embodiments, the bypass switch 100 typically is not switched to provide a pulsed signal. Instead, the bypass switch 100 is open during testing so that all of the current flows through the test resistor 97. During non-testing operation, the bypass switch 100 is closed to provide a high capacity current path between the low side of the power supply 44 and ground. The high capacity current path allows several displays 46 to be active simultaneously by providing ample anode current to operate several displays 46. Moreover, the test resistor 97 can have a relatively large impedance to improve sensitivity of the current-to-voltage converter 95 because the test resistor 97 does not carry high current during either testing or normal operation.

While the invention has been presented by way of exemplary embodiments, various modifications may be made without deviating from the spirit and scope of the invention. For instance, although the controller 70 is preferably microprocessor-based, other structures and methods may be used for controlling operation of the testing circuit 40, including manual operation. For example, the switches 52, 84 in the embodiment of FIG. 5, can be controlled manually or by the controller 70. One skilled in the art will also recognize that the testing method described herein can be altered such that the sampling switch 52 is normally open and is switched from open to closed during testing. In such an approach, the node voltage $V_N$ would rise by 4 V in response to activation of the sampling switch Ω rather than dropping by 4 V, as shown in FIG. 2C. Also, the testing circuit 40 and the video signal generator 45 can be implemented within the field emission display 46 to provide an indication of the anode current. Such an embodiment would be particularly applicable where the anode voltage or anode current is controlled through a feedback circuit. Further, the voltage monitor 62 can directly display the node voltage $V_N$ on a conventional display, or can record the node voltage $V_N$ as a conventional storage medium, such as a computer disk or chart recorder. Accordingly, the invention is not limited, except as by the appended claims.

We claim:

1. A current measuring circuit for measuring anode current in a field emission display, comprising:
   a high voltage source;
   a sampling circuit having an input coupled to the high voltage source and an output coupled to the field emission display, the sampling circuit including a testing path from the input to the output and a bypass path, wherein the bypass path is switchable in response to a control signal from a first state in which the bypass path bypasses a first portion of the testing path to a second state in which the bypass path does not bypass the first portion of the testing path; and
   a signal sensing circuit coupled to the sampling circuit and configured to detect a differential change in voltage at a location in the sampling circuit when the bypass path is switched between the first and second states.

2. The measuring circuit of claim 1 wherein the testing path comprises a series impedance and the bypass path is coupled in parallel with the series impedance.

3. The measuring circuit of claim 2 wherein the bypass path is a switch.

4. The measuring circuit of claim 3 wherein the switch is an optoisolator.

5. The measuring circuit of claim 2 wherein the bypass path is a transistor.

6. The measuring circuit of claim 1 wherein the sensing circuit includes a capacitor coupled between the output of the sampling circuit and the location in the sampling circuit where the differential change in voltage is detected.

7. The measuring circuit of claim 6 wherein the sensing circuit further includes a biasing impedance serially coupled to the capacitor.

8. The measuring circuit of claim 7, further comprising a voltage monitor coupled at a node joining the capacitor and the biasing impedance.

9. A current measuring circuit for measuring anode current in a field emission display, comprising:
   a high voltage terminal and a low voltage terminal wherein the high voltage terminal is couplable to the field emission display to provide an input current path to the field emission display and the low voltage terminal is coupled to a reference potential to form a return current path;
   a sampling circuit coupled in the input current path or the return current path, the sampling circuit including a testing path and a bypass path for current to pass through the sampling circuit, wherein the bypass path is selectively activatable to bypass a first portion of the testing path; and
   a signal sensing circuit coupled to the sampling circuit and configured to detect a differential change in voltage at a location in the sampling circuit when the bypass path is activated.

10. The measuring circuit of claim 9 wherein the testing path comprises a series impedance and the bypass path is coupled in parallel with the series impedance.

11. The measuring circuit of claim 10 wherein the bypass path is a switch.

12. The measuring circuit of claim 9 wherein the sampling circuit is coupled in the input current path and wherein the sensing circuit includes a capacitor coupled between the output of the sampling circuit and a reference potential.

13. A testing system for measuring anode current of a field emission display, comprising:
   a voltage source having a high voltage output terminal and a low voltage terminal wherein the high voltage terminal is coupled to the field emission display to provide an input current path between the voltage source and the field emission display and the low voltage terminal is coupled to a reference potential to form a return current path;
   a sampling circuit coupled in the input current path or the return current path, the sampling circuit having an input and an output, the sampling circuit further including a testing path and a bypass path for current to pass from the input to the output, wherein the bypass path is selectively activatable to bypass a first portion of the testing path; and
   a monitoring circuit capacitively coupled to the output of the sampling circuit and configured to detect a differential change in voltage at a the output of the sampling circuit when the bypass path is activated.

14. The testing system of claim 13 wherein the monitoring circuit includes:
   a capacitor that capacitively couples the monitoring circuit to the output of the sampling circuit; and
   a biasing impedance serially coupled between the capacitor and a reference potential.

15. The testing system of claim 14 wherein the testing path includes a sampling resistor.

16. The testing system of claim 14 wherein the bypass path includes a switch having an externally accessible control terminal, the switch being coupled in parallel with the first portion of the testing path.

17. A display apparatus, comprising:
   an emitter substrate;
   a display screen aligned to the emitter substrate, the display screen including a transparent conductive anode;
   an input terminal coupled to the anode to provide an input current path to the anode;
   a sampling circuit coupled in the input current path, the sampling circuit including a testing path and a bypass path for current to pass through the sampling circuit, wherein the bypass path is selectively activatable to bypass a first portion of the testing path; and
   a signal sensing circuit coupled to the sampling circuit and configured to detect a differential change in voltage at a location in the sampling circuit when the bypass path is activated.

18. The display apparatus of claim 17 wherein the testing path comprises a series impedance and the bypass path is coupled in parallel with the series impedance.

19. The measuring circuit of claim 17 wherein the bypass path is a switch.

20. The measuring circuit of claim 17 wherein the sampling circuit is coupled in the input current path and wherein the sensing circuit includes a capacitor coupled between the output of the sampling circuit and a reference potential.

21. A current measuring circuit for measuring anode current in a field emission display having an anode and an emitter panel, the anode drawing anode current in response to an anode voltage between the anode and a selected circuit node and electron emission from the emitter panel, comprising:
   a high voltage source having a high voltage terminal coupled to the anode and a low voltage terminal coupled to the selected circuit node;
   a current monitoring circuit coupled to either of the high voltage terminal or the low voltage terminal;
   a control circuit coupled to the emitter panel and operative to selectively activate the emitter panel and cause the emitter to emit electrons; and
   a signal sensing circuit coupled to the current monitoring circuit and configured to detect a differential change in voltage at a location in the current monitoring circuit in response to activation of the emitter.

22. The measuring circuit of claim 21 wherein the current monitoring circuit includes a series impedance.

23. The measuring circuit of claim 22 wherein the current monitoring circuit further includes a buffer amplifier coupled to the series impedance.

24. The measuring circuit of claim 21 wherein the control circuit includes an image signal source.

25. A testing system for measuring anode current of a plurality of field emission displays having respective anodes, the field emission displays further being coupled to a selected node, comprising:
   a voltage source having a high voltage output terminal and a low voltage terminal, the high voltage terminal being coupled to the anodes to provide an input current path between the voltage source and the anodes and the low voltage terminal is coupled to the selected node to form a return current path;
   a signal source coupled to the field emission displays and operative to separately provide a first signal corresponding to a desired image and to provide a second signal corresponding to a blank image, the signal source being switchable to provide the first signal to each of the displays in sequence while providing the second signal to the others of the displays; and
   a current monitor in either the input current path or the return current path and configured to detect current through the input or return path in response to the first and second signals.

26. The testing system of claim 25 wherein the current monitor includes a test impedance serially coupled between the low side of the voltage supply and the selected node.

27. The testing system of claim 26, further including a bypass path coupled in parallel with the test impedance.

28. The testing system of claim 25 wherein the selected node is coupled to a reference potential.

29. A testing system for measuring anode current of each display in a bank of displays, comprising:
   a high voltage testing source;
   a high voltage burn-in source;
   a plurality of supply lines, separately coupled to respective displays;
   a first set of switches coupled between the testing source and respective ones of the supply lines;
   a second set of switches coupled between the burn-in source and the respective ones of the supply lines;
   a testing circuit having an input coupled to the testing source and an output coupled to the first sets of switches, the testing circuit being configured to measure current provided by the testing source; and
   a control circuit coupled to selectively activate switches in the first and second sets of switches.

30. The testing system of claim 29 wherein the testing circuit includes a testing path from the testing circuit input to the testing circuit output and a bypass path, wherein the bypass path is switchable in response to a testing signal from a first state in which the bypass path bypasses a first portion of the testing path to a second state in which the bypass path does not bypass the first portion of the testing path.

31. The testing system of claim 30 wherein the testing circuit further includes a signal sensing circuit coupled to the testing circuit and configured to detect a change in voltage at a location in the testing circuit when the bypass path is switched between the first and second states.

32. The testing system of claim 31 wherein the sensing circuit includes:
   a capacitor coupled between the output of the testing circuit and a reference potential; and
   a biasing impedance serially coupled to the capacitor.

33. The testing system of claim 30, further including a burn-in oven, wherein each of signal lines in the plurality of signal lines extends out of the burn-in oven, and wherein the switches in the first and second sets of switches are outside of the burn-in oven.

34. A method of measuring current draw of a display, comprising:
   producing a driving voltage;

coupling the driving voltage to the display through a testing circuit;

drawing current with the display;

temporarily passing a portion of the current through a sampling impedance to produce a temporary voltage change;

monitoring the temporary voltage change caused by the portion of the current passing through the sampling impedance; and determining from the monitored voltage change the current draw of the display.

35. The method of claim 34 wherein a switch is coupled in parallel with the sampling impedance and the step of temporarily passing a portion of the current through the sampling impedance includes the step of opening the switch.

36. The method of claim 35 wherein the step of monitoring the temporary voltage change caused by the portion of the current passing through the sampling impedance comprises the step of detecting a change in output voltage of the sampling impedance when the switch is opened or closed.

37. The method of claim 36 wherein the step of detecting a change in output voltage of the sampling impedance when the switch is opened or closed includes the step of tapping an output terminal of the sampling impedance with a capacitively coupled sensing circuit.

38. A method of testing anode current of a plurality of displays, comprising the steps of:

providing a testing voltage;

providing a supply voltage substantially equal to the testing voltage;

supplying the supply voltage to the displays;

supplying the testing voltage to one of the displays simultaneously with the supply voltage;

removing the supply voltage from the one of the displays without removing the testing voltage; and measuring the current draw of the one of the displays from the testing voltage after removing the supply voltage.

39. The method of claim 38, further including the step of, after measuring the current draw of the one of the displays, re-supplying the supply voltage without removing the testing voltage from the one of the displays.

40. The method of claim 39, further including the step of after re-supplying the supply voltage, removing the testing voltage from the one of the displays.

41. A method of measuring anode current of an anode in a field emission display, comprising the steps of:

referencing the display to a reference voltage;

providing to the anode a supply voltage from a high side of a high-voltage supply;

connecting a current-to-voltage converter between the reference voltage and a low side of the high-voltage supply; and monitoring an output voltage of the current-to-voltage converter.

42. The method of claim 41 wherein the step of connecting a current-to-voltage converter between the reference voltage and the low side includes the step of electrically actuating a switch coupled to the current-to-voltage converter.

43. A method of measuring current draw of an anode in a selected one of a plurality of field emission displays, comprising:

producing an anode voltage with an anode voltage source;

providing the anode voltage to the anodes of all of the displays;

producing a first driving voltage corresponding to a first activation level of the display;

producing a second driving voltage corresponding to a second activation level of the display;

applying the first driving voltage to the selected one of the displays;

applying the second driving voltage to the others of the displays; and monitoring current flow into or out of the anode voltage source in response to the applied first and second driving voltages.

44. The method of claim 26 wherein the step of monitoring current flow into or out of the anode voltage source in response to the applied first and second driving voltages includes the steps of:

coupling a test resistance to an input or output of the anode voltage source; and monitoring voltage drop across the test resistor.

45. The method of claim 44 wherein a bypass path is coupled in parallel with the test resistor, further comprising the step of disabling the bypass path.

* * * * *